United States Patent [19]

Schwenk et al.

[11] Patent Number: 5,894,106
[45] Date of Patent: Apr. 13, 1999

[54] ELECTRONICS CABINET

[75] Inventors: Hans Martin Schwenk, Straubenhardt; Uwe Rieger, Karlsbad; Hennin Wick, deceased, late of Straubenhardt, by Brigitte Wick, legal representative; Paul Rutherford, Straubenhardt, all of Germany

[73] Assignee: Schroff GmbH, Straubenhardt, Germany

[21] Appl. No.: 08/827,954

[22] Filed: Apr. 11, 1997

[30] Foreign Application Priority Data

Apr. 13, 1996 [DE] Germany .............. 196 14 692

[51] Int. Cl.⁶ .................................. H01J 5/00
[52] U.S. Cl. ................ 174/50; 312/264; 361/800
[58] Field of Search ................ 174/50, 52.3, 35 GC, 174/35 MS, 135; 361/816, 818, 800; 220/4.02, 3.8; 312/109, 199, 270.2, 249.3, 249.7, 291, 223.1, 223.2, 223.6, 265.2, 265.3, 265.4, 263, 264

[56] References Cited

U.S. PATENT DOCUMENTS

| | | | |
|---|---|---|---|
| 1,374,868 | 4/1921 | White et al. | 312/265.2 |
| 2,753,390 | 7/1956 | Feketics | 174/35 MS |
| 2,757,225 | 7/1956 | Dunn | 174/35 MS |
| 3,034,844 | 5/1962 | Anderson et al. | 312/265.4 |
| 3,056,639 | 10/1962 | Caminker et al. | 312/108 |
| 3,110,535 | 11/1963 | Anderson | 312/350 |
| 4,803,306 | 2/1989 | Malmquist. | |
| 5,536,079 | 7/1996 | Kostic | 312/265.3 |

FOREIGN PATENT DOCUMENTS

| | | |
|---|---|---|
| 41 27 468 C1 | 10/1992 | Germany . |
| 295 09 102 U1 | 8/1996 | Germany . |
| 2 223 359 | 4/1990 | United Kingdom . |
| WO 93/2067 | 10/1993 | WIPO . |

*Primary Examiner*—Dean A. Reichard
*Assistant Examiner*—Dhiru R Patel
*Attorney, Agent, or Firm*—Merchant, Gould, Smith, Edell, Welter & Schmidt

[57] ABSTRACT

The invention deals with an electronics cabinet with a shelving frame of sectional rails 8 on which casings 2,3 are attached. On the insides 19 of the casings 2,3, longitudinal grooves 38 are designed in which contact springs 24 lock into. The contact ridges 27 of these contact springs 24 lie at each neighboring sectional rail 8 when the casings 2,3 are attached.

10 Claims, 3 Drawing Sheets

ELECTRONICS CABINET

FIELD OF THE INVENTION

The invention concerns an electronics cabinet with a shielding frame of sectional rails, with attached casings on the side rails as well as electrical contact springs between the shelving frames and the casings.

BACKGROUND OF THE INVENTION

Electronics cabinets serve to hold devices that are normally built for stationary electronic building groups.

The invention that finds application by the endeavor to sound proof high frequency electronics cabinets whereby shielding effect is exhibited, electromagnetic inflows are provided, or that which contains such devices that cause electromagnetic disturbances that are not allowed to reach the outside. The most difficult leakage points to conquer for these types of cabinets are the narrow vertical and horizontal slots between the casings, i.e., the sidewalls, backwall door, and shelving frame. Therefore, at these critical points, a contact device is inserted which should produce a HF-density electrical contact on the cabinet elements directly neighboring or lying across from it.

It is known for example to place cross-sectional s-shaped stripes of electrical contact springs on the edges of the casings. On the one side the edges spring closed against the electrical contact springs and on the other side they are pressed through spring action against the opposing component (DE 41 27 468). Furthermore it is known to place elastic padding of a conductive material, to insulate the slots, between cabinet elements (DE 43 07 805). On the one hand, the electromagnetic shielding effect of this known measure is unsatisfactory, on the other, they are susceptible to mechanical damages due to their construction, because they extend unprotected over the edges of the casing. An additional problem is reliably keeping the contact points free from lacquer in order to achieve lower electrical cross-over resistance. In addition to this, a housing for electrical devices is known whose metal rails show high frequency insulating clamping cross-bar pieces with pushed-up u-shaped contact springs. Beside these clamping cross-bar pieces longitudinal chambers can be seen. The arrangement is such that when handling the metal surface of the rail on the back side of the clamping cross-bar piece, which lies on the inside of the longitudinal chamber, an electrical contact zone remains unlaquered (DE43 11 246).

The task of the invention is based on the desire to create a cost effectively made and simply assembled electronics cabinet with an especially effective, tough, and stable high frequency type of insulation for the vertical and horizontal slots between certain leakage points on the casing.

SUMMARY OF THE INVENTION

As a solution to the proposed task we will start out with an electronics cabinet with an opening of the mentioned building type, with a shelving of sectional rails, casings attached to the sectional rails, as well as electrical contact springs between the sectional rails and the casings.

The task will be solved such that on the inside of the casing's edge narrow longitudinal grooves are designed that the contact springs bear push-on bases, that the push-on bases attach into the longitudinal groove, that the contact springs show plate springs at an obtuse angle on their push-on bases, that the open ends of the plate springs on the contact springs are used to form contact ridges in the direction of the push-on bases which are similarly bent back twice, and that with the casings in place, the contact ridge lies upon the neighboring sectional rail under the tension of the plate springs.

The proposed fastening, according to the invention, has specially formed contact springs, and for that purpose, narrow longitudinal grooves in the casing are provided and equipped with a simple construction. The insertion of the contact springs into the longitudinal grooves is associated with very modest assembly expenditures. When electrostatically covering the casings, the inner walls of the narrow longitudinal grooves remain clear, a special operation necessitated for the protection of perfect electrical connections between the casing sections and the contact springs. The danger of damages to the designed points protecting the edges of the casing sections assembled contact springs is slim.

It is effective to use holding tabs that are similarly bent twice for the formation of the longitudinal groove. With the help of the these on the insides of the casing sections, attached holding tabs allow themselves to be produced in a simple manner corresponding to the desired longitudinal groove. It is understood that the longitudinal groove can also be created through multiple tilting of the relevant casing segment.

The holding tabs are advantageously attached to each side at an obtuse angle and equipped with support brackets that are formed through beveling, for the plate springs. They serve to protect the contact springs which can lay on the support brackets, over which they jut out only slightly when under a mechanical load.

In an arrangement of the invention, the push-on bases of the contact springs show a narrow u-shaped cross-section which fits straight into the longitudinal groove and is therefore a section of a simple locking connection. In order to form a fixed attachment of the contact spring in the longitudinal groove, both u-flanges of the push-on bases ear outwardly formed barbs which, after successful insertion, grip the groove walls. In addition, they guarantee an excellent electrical contact between the relevant casing and the contact springs.

The contact springs advantageously form a spring strip which, according to need, can be cut to length during assembly.

It can be useful when narrow bridges are provided between the open ends of the plate springs of the contact springs on the spring strip. This measure eases the handling of the spring strip when inserted into the longitudinal groove and offers protection against damage to the corners of the plate springs during transport and storage.

In an arrangement of the invention the cover section of the sectional rails have edge brackets on both sides. This offers advantageous installation surfaces for the contact ridges of the plate springs.

On one of the edge brackets of the cover section tilt brackets can be attached at an obtuse angle, which serves as a slanted opening for the contact ridges and eases the closing of the swing door.

Across from the tilt bracket of the cover section lie yielding elastic joint paddings which are arranged on the insides of the casings. It minimizes the effect of the inflow of water and dust into the inside of the cabinet and at the same time can serve as an installation surface for the ends of the plate springs when inappropriately loaded.

BRIEF DESCRIPTION OF THE DRAWINGS

The invention will be more closely explained below through the three enclosed drawings.

Thereby showing.

DETAILED DESCRIPTION OF THE INVENTION

Those carrying devices that receive and serve the purpose of insertion and those that belong to those categories, such as ventilation and cooling device receptive electronics cabinets, consist of a shelving frame 1, four casings 2, 3, 4, and 5, as well as a cover 6, and a base 7.

Figure 1:
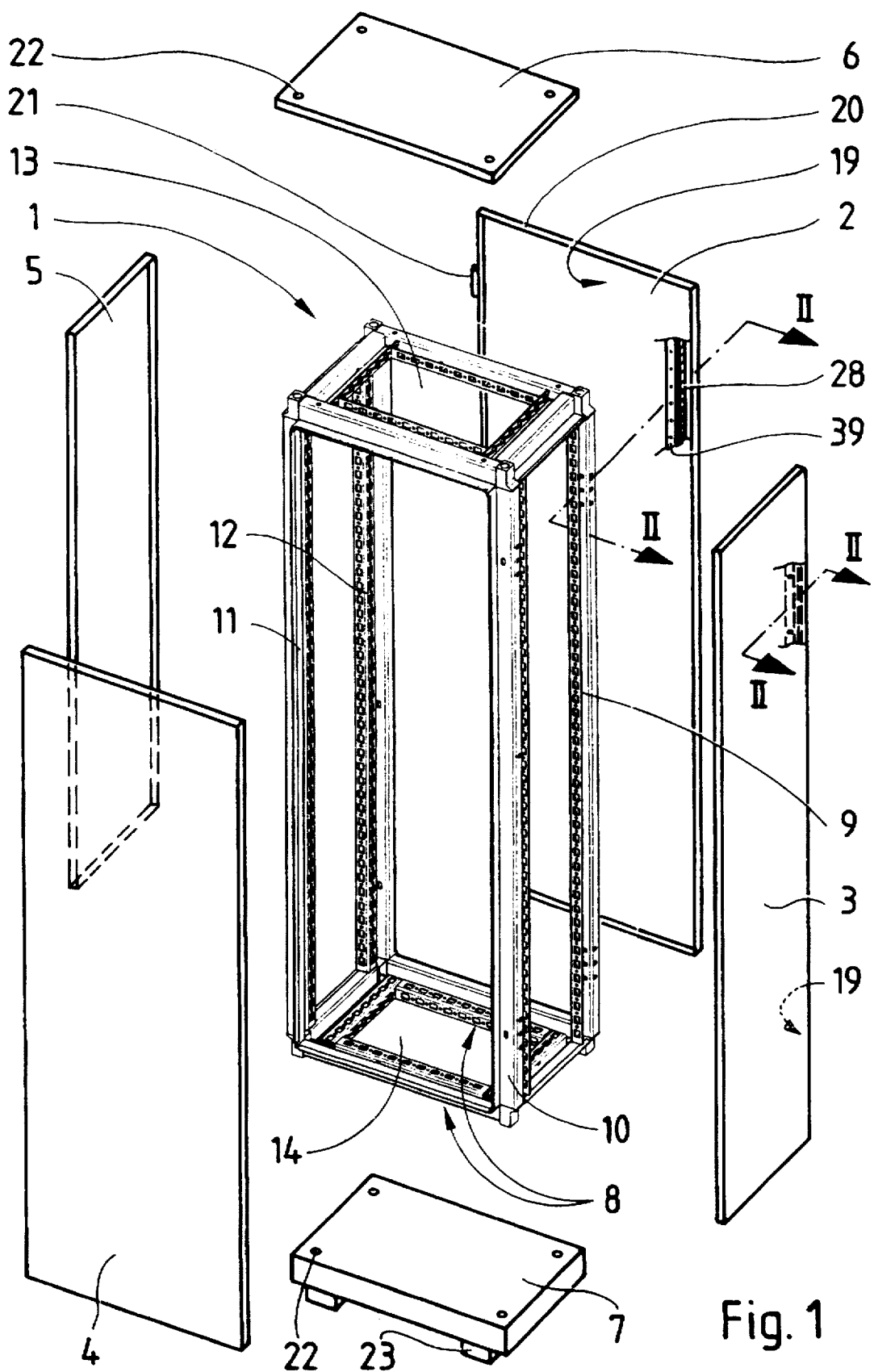
FIG. 1 an electronics cabinet with a shelving frame and four casings, portrayed in an explosive perspective.
Figure 2:
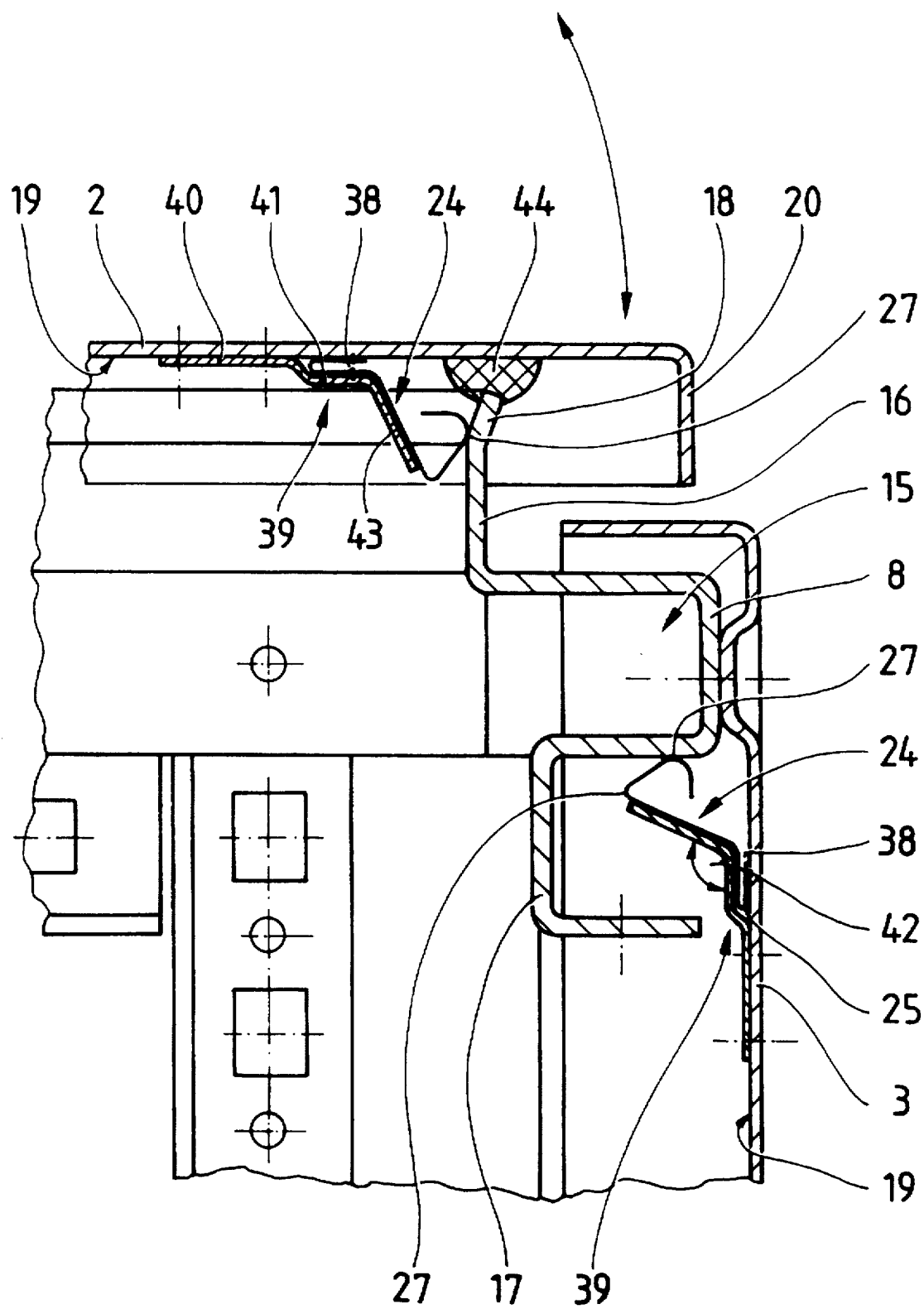
FIG. 2 the formation from a tilting of the electronics cabinet as seen in FIG. 1, in horizontal cross-section, cut along the lines II—II in FIG. 1, in increased scale.

The shelving frame 1 is made of twelve sectional rails 8 of the same shape put together, which form four vertical rails 9 through 12, a cover frame 13, and a base frame 14. The cover frame 13 and the base frame 14 are each made of four sectional rails 8 joined together running at right angles. All sectional rails 8 show, see especially FIG. 2, a cover section 15 with two edge brackets 16 and 17 on each side. On one of (16) the two edge brackets 16, 17 a tilt bracket 18 is attached at an acute angle.

The casings 2 through 5 deal with a plate-shaped prefabricated component with encompassing bent-up right angled edges 20 that point towards the insides 19. The casing 2 forms a swinging door with hinges 21 which strikes on shelving frame 1, the casings 3 and 5 form the side walls, and the casing 4 forms the back wall of the electronics cabinet. The cover 6 and the base 7 are screwed onto cover frame 13 and base frame 14, respectively. Screw holes 22 serve this purpose. The base 7 has stands 23. For the purpose of insulating the electronics cabinet against external and internal high frequency interference radiation, electrical contact springs 24 are provided between the sectional rails 8 and the casings 2 through 5.

Figure 3:
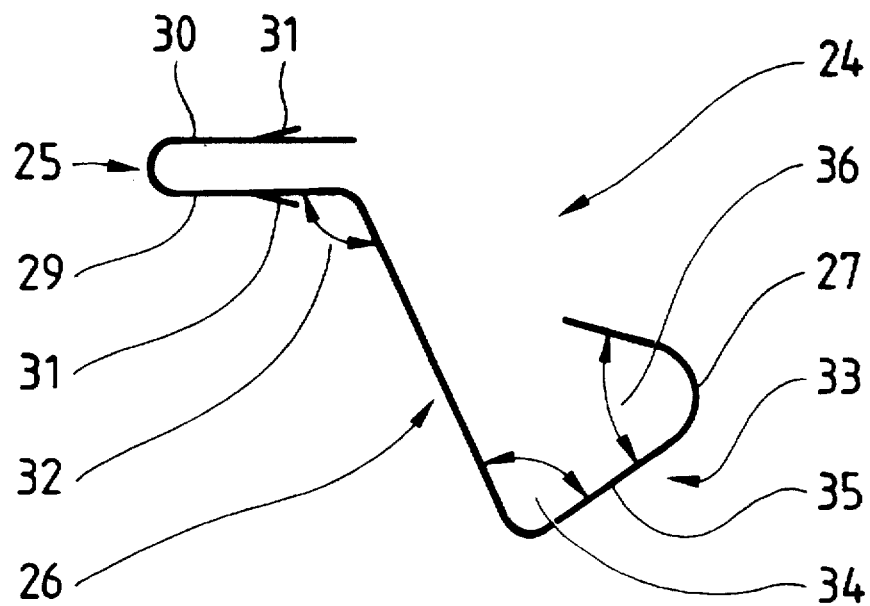
FIG. 3 a contact spring corresponding to those in FIG. 2 in a front view, in released tension state, in a several times over enlarged scale.
Figure 4:
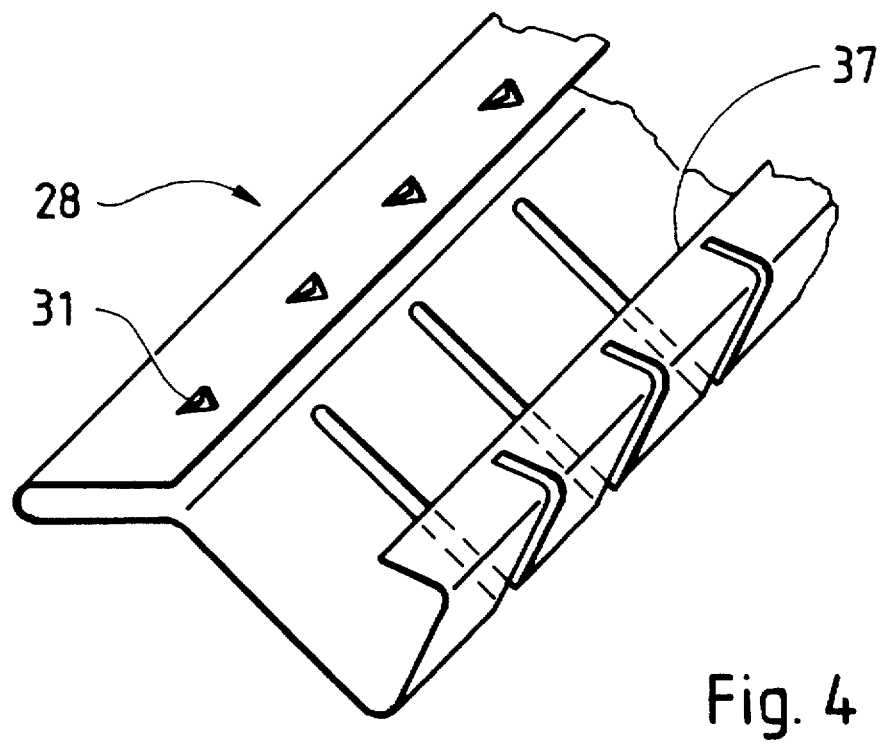
FIG. 4 a spring strip made of contact springs according to FIG. 3, shown perspectively.

The contact springs 24 show—compare FIGS. 3 and 4—push-on bases 25, plate springs 26, and contact ridges 27. They consist of a thin, springy, corrosion-resistant sheet metal, are finished through stamp and bend processes, and form a spring strip 28. The push-on bases 25 show a narrow, u-shaped cross-section (FIG. 3) which bear outwardly bent formed barbs 31 on both u-flanges 29 and 30.

On the push-on bases 25 the spring strip 28 is formed at an obtuse angle 32. The open ends 33 of the plate springs 26 of the contact springs 24 are bent back twice similarly in the direction of the push-on bases 25 for the formation of the contact ridge 27. This bending next occurs at a closer right angle 34 and finally, after a straight shoulder 35, at an acute angle 36 of approximately thirty-five degrees. The open ends 33 of the plate springs 26 on all contact springs 24 of a spring strip 28 are connected with one another through a narrow continuing bridge 37.

On the insides 19 of the four casings 2 through 5 (FIG. 2) narrow longitudinal grooves 38 are designed near the edge that open to the edges 20 of the casings 2 through 5. Holding tabs 39, bent twice similarly, serve to form these longitudinal grooves 38. These holding tabs 39 are welded with their footing tabs 40 on the insides 19 of the casings 2 through 5. Together with their cover 41 and insides 19 they form the pocket-like longitudinal grooves 38. The holding tabs 39 are equipped with support brackets 43 which are attached at an obtuse angle 42 on the cover 41.

This obtuse angle 42 corresponds to the obtuse angle (32) between the push-on bases 25 and the contact springs' 24 plate springs.

The push-on bases 25 of the contact springs 24 connect into the longitudinal grooves 38 (FIG. 2), in which the plate springs 26 of the contact springs 24 lie against the support brackets 43 and protrude somewhat.

When the casings 2 through 5 are in place, which means that the attached back wall (4), both side walls (3 and 5), and closed swinging door (2) are all in place on the shelving frame, the contact ridges 27 of all contact springs 24 lie upon each neighboring sectional rail 8 under the corresponding tension of the plate springs 26.

Joint padding 44 made of flexible elastic material is attached on the inside 19 of the swinging door (2). These are arranged so that they lie across from the tilt bracket 18 and the cover section 15.

What is claimed is:

1. An electronics cabinet comprising:

a shelving frame having sectional rails;

a casing attached to the sectional rails;

electrical contact springs between the sectional rails and the casing, the casing having narrow longitudinal grooves on insides of the casing near edges of the casing;

the contact springs having push-on bases that insert into the longitudinal grooves;

the contact springs having plate springs at an obtuse angle to the push-on bases;

the contact springs having open ends forming a contact ridge and are bent back similarly twice in a direction of the push-on bases; and wherein the contact ridge lies on existing neighboring sectional rails under tension of the plate springs.

2. The electronics cabinet according to claim 1, wherein the longitudinal grooves comprise two similarly beveled holding tabs.

3. The electronics cabinet according to claim 2, wherein the plate springs further comprise holding tabs put in place at an obtuse angle with support brackets.

4. The electronics cabinet according to claim 1, wherein the push-on bases comprise a narrow u-shaped cross-section.

5. The electronics cabinet according to claim 4, wherein the push-on bases comprise u-flanges having outward propped barbs.

6. The electronics cabinet according to claim 1, wherein the contact springs form a spring strip.

7. The electronics cabinet according to claim 6, wherein the plate springs further comprise narrow bridges between the open ends on the spring strip.

8. The electronics cabinet according to claim 1, wherein the sectional rails comprise cover sections with edge brackets on both sides.

9. The electronics cabinet according to claim 8, wherein the cover sections comprise tilt brackets attached at an obtuse angle to one of the edge brackets.

10. The electronics cabinet according to claim 9, wherein the tilt brackets lie across from yielding elastic joint padding arranged on the insides of the casings.

* * * * *